United States Patent
Sente et al.

(10) Patent No.: US 9,464,198 B2
(45) Date of Patent: Oct. 11, 2016

(54) CONDUCTIVE PASTE, METHOD FOR FORMING CONDUCTIVE PATTERN, AND OBJECT WITH PRINTED CONDUCTIVE PATTERN

(71) Applicant: DIC Corporation, Tokyo (JP)

(72) Inventors: Yasuhiro Sente, Sakura (JP); Tsutomu Kanno, Sakura (JP); Tomoko Okamoto, Sakura (JP); Yoshinori Katayama, Sakura (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 14/440,199

(22) PCT Filed: Jan. 23, 2014

(86) PCT No.: PCT/JP2014/051367
§ 371 (c)(1),
(2) Date: May 1, 2015

(87) PCT Pub. No.: WO2014/119463
PCT Pub. Date: Aug. 7, 2014

(65) Prior Publication Data
US 2015/0299478 A1 Oct. 22, 2015

(30) Foreign Application Priority Data
Jan. 30, 2013 (JP) .................................. 2013-015435

(51) Int. Cl.
*H05K 1/00* (2006.01)
*C09D 5/24* (2006.01)
(Continued)

(52) U.S. Cl.
CPC .............. *C09D 5/24* (2013.01); *C09D 11/037* (2013.01); *C09D 11/10* (2013.01); *C09D 11/52* (2013.01);
(Continued)

(58) Field of Classification Search
CPC ............ H01B 1/02; H01B 1/22; C22C 1/00; B22D 17/00
USPC ...... 174/268; 252/514, 519.2; 148/327, 400, 148/420, 425, 433; 75/10.65, 252, 352
See application file for complete search history.

(56) References Cited

U.S. PATENT DOCUMENTS 3,936,298 A * 2/1976 Mehrabian .............. C22C 1/005
148/400
3,948,650 A * 4/1976 Flemings ................ C22C 1/005
148/400

(Continued)

FOREIGN PATENT DOCUMENTS

| JP | 2010-159350 A | 7/2010 |
| JP | 2010-235780 A | 10/2010 |
| JP | 2011-037999 A | 2/2011 |

OTHER PUBLICATIONS

International Search Report mailed Apr. 22, 2014, issued for PCT/JP2014/051367.

*Primary Examiner* — Xiaoliang Chen
(74) *Attorney, Agent, or Firm* — Locke Lord LLP

(57) ABSTRACT

A conductive paste providing an intended conductive pattern having high linearity and having no disconnection, short circuits, or the like even in the case of performing gravure offset printing with a gravure plate having a bezel pattern. A conductive paste for bezel-pattern printing performed by a gravure offset printing process includes conductive metal particles (A); an organic compound (B) that is solid at 50° C. and has a boiling point of more than 300° C. at normal pressure; an organic compound (C) that is liquid at 50° C. and has a boiling point of more than 300° C. at normal pressure; and an organic solvent (D) that is not the (B) or (C), does not have reactivity with the (B) or (C), and has a boiling point of 170° C. to 300° C. at normal pressure. A method for forming a conductive pattern by a gravure offset printing process employs the above-described conductive paste.

20 Claims, 1 Drawing Sheet

(51) Int. Cl.
*H05K 1/09* (2006.01)
*H05K 3/12* (2006.01)
*C09D 11/037* (2014.01)
*C09D 11/10* (2014.01)
*C09D 11/52* (2014.01)
*C09D 17/00* (2006.01)
*H05K 3/10* (2006.01)

(52) U.S. Cl.
CPC ............... *C09D 17/00* (2013.01); *H05K 1/092* (2013.01); *H05K 1/095* (2013.01); *H05K 3/107* (2013.01); *H05K 3/1275* (2013.01)

(56) References Cited

U.S. PATENT DOCUMENTS

| | | | | |
|---|---|---|---|---|
| 3,951,651 A | * | 4/1976 | Mehrabian | B22D 1/00 164/900 |
| 3,954,455 A | * | 5/1976 | Flemings | C22C 1/005 148/400 |
| 4,108,643 A | * | 8/1978 | Flemings | C22C 1/005 148/327 |
| 4,345,637 A | * | 8/1982 | Flemings | B22D 17/00 164/113 |
| 8,303,854 B2 | * | 11/2012 | Kajiwara | B22F 3/22 252/514 |
| 2007/0048166 A1 | * | 3/2007 | Hammond | B22F 1/0059 419/10 |

* cited by examiner

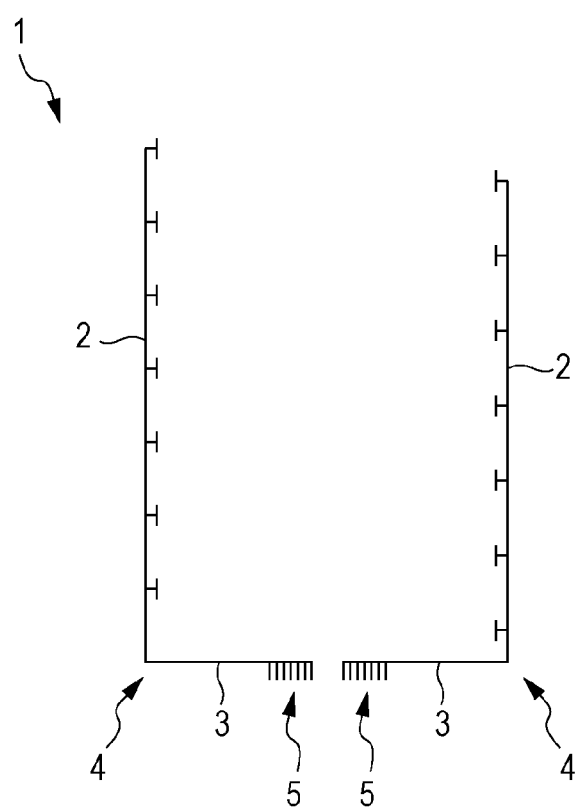

ered with a U-shape rotated 90°
CONDUCTIVE PASTE, METHOD FOR FORMING CONDUCTIVE PATTERN, AND OBJECT WITH PRINTED CONDUCTIVE PATTERN

TECHNICAL FIELD

The present invention relates to a conductive paste for forming a conductive film, a method for forming a conductive pattern, and a conductive-pattern-printed product.

BACKGROUND ART

Known methods for forming conductive patterns of conductive circuits, electrodes, or the like used for touch panels, electronic paper, and various electronic components are a printing method and an etching method.

In a case of employing the etching method to form a conductive pattern, it is necessary to form a patterned resist film by photolithography on various metal films deposited on a substrate, subsequently to dissolve and remove unnecessary portions of the deposited metal films in a chemical or electrochemical manner, and finally to remove the resist film. Thus, the steps are very complicated and are not suitable for mass production.

On the other hand, in a case of employing the printing method, desired patterns can be mass-produced at low cost and printed films are dried or cured to thereby easily acquire conductivity. Such printing processes include flexographic printing, screen printing, gravure printing, gravure offset printing, inkjet printing, and the like, which have been proposed in accordance with the line width, thickness, or production speed of the pattern to be formed. Recently, from the viewpoint of, for example, size reduction of electronic devices and improvements in design, there is a demand for a fine conductive pattern formed by printing and having, for example, a line width of 50 µm or less, which is difficult to print by commonly used screen printing.

In addition, in order to meet an increasing demand for reduction in the thickness and weight of electronic devices and for flexible electronic devices and in order to employ highly productive roll-to-roll printing, there is a demand for a conductive paste that is applied to a plastic film by printing and is fired at low temperature for a short period of time to thereby achieve high conductivity, adhesion to the substrate, film hardness, and the like. In addition, there is a demand for a conductive paste that provides such properties when the conductive paste is applied by printing to printing objects such as, among plastic films, inexpensive and highly transparent PET films and transparent conductive films having ITO films on PET films.

From such a viewpoint, for the purpose of obtaining finer conductive patterns at higher productivity, among the above-described various printing processes, instead of the screen printing process, the gravure offset printing process is attracting attention. The gravure offset printing process is employed to print a fine wiring pattern by using a gravure plate having a recess that corresponds to image lines and is to be filled with a paste, a doctor configured to fill the recess of the gravure plate with the paste, a blanket cylinder to which the paste is transferred from the recess of the gravure plate, and a press cylinder disposed so as to face the blanket cylinder such that printing objects are supplied between the press cylinder and the blanket cylinder.

Known examples of such a method in which a conductive paste containing a resin component is used, printing is performed on a printing object by the gravure offset printing process, and firing is performed to form a conductive pattern, include methods of using resins that are themselves solid at 50° C. such as polyester resins, acrylic resins, epoxy resins, and ethyl cellulose (refer to Patent Literatures 1 and 2); and methods of using such resins in combination with resins that are liquid at 50° C. such as oxetane-based resins, epoxy-based resins, or vinyl-ether-based monomers (refer to Patent Literature 3).

However, such gravure plates used in Patent Literatures (PTLs) 1 to 3 have linear recesses to be filled with paste and do not have what is called bezel-pattern recesses, which are used for actual electronic components and are constituted by two or more linear recesses connected together so as to have, for example, a regular L shape, an inverted L shape, a U-shape rotated 90° anticlockwise, a U-shape rotated 90° clockwise, or a square-frame shape.

PTL 1: Japanese Unexamined Patent Application Publication No. 2010-159350
PTL 2: Japanese Unexamined Patent Application Publication No. 2010-235780
PTL 3: Japanese Unexamined Patent Application Publication No. 2011-37999

DISCLOSURE OF INVENTION

Technical Problem

There have been no actual evaluations in terms of printing suitability with gravure plates having complicated recesses such as the above-described bezel patterns.

Thus, for example, use of the conductive pastes in PTLs 1 to 3 for gravure plates having simple recesses such as linear recesses described in the PTLs provides intended conductive patterns having high linearity and having no disconnection, short circuits, or the like; on the other hand, use of the conductive pastes in PTLs 1 to 3 for printing with gravure plates having complicated recesses such as bezel-pattern recesses used for actual electronic components often fails to provide the above-described intended performance, which has been problematic.

Such a problem probably occurs very seriously in gravure offset printing using a gravure plate having a finer complicated recess such as a bezel-pattern recess having a smaller line width than before.

Solution to Problem

Accordingly, in order to address such a problem, the inventors of the present invention performed thorough studies. As a result, the inventors have found the following findings: a conductive paste suitable for a gravure plate having a complicated recess is prepared such that the content of non-volatile matter of the organic compound (B) relative to the total of four components of the conductive metal particles (A) to the organic solvent (D) is made lower than before and a mass ratio R/P of non-volatile matter of the organic compound (B) and the organic compound (C) to the conductive metal particles (A) is made lower than before, so that the above-described problem is addressed. Thus, the inventors have accomplished the present invention.

Specifically, the present invention provides a conductive paste for bezel-pattern printing performed by a gravure offset printing process, the conductive paste including conductive metal particles (A); an organic compound (B) that is solid at 50° C. and has a boiling point of more than 300° C. at normal pressure; an organic compound (C) that is liquid at 50° C. and has a boiling point of more than 300° C. at normal pressure; and an organic solvent (D) that is not the component (B) or (C), does not have reactivity with the (B) or (C), and has a boiling point of 170° C. to 300° C. at normal pressure, wherein a ratio of non-volatile matter of the (B) to a total of the (A) to (D) in terms of mass is 1.0% to 3.0%, and a mass ratio R/P of a total amount R of, in terms of mass of non-volatile matter, the organic compound (B) and the organic compound (C) used to an amount P of the conductive metal particles (A) used is 0.07 to 0.15.

The present invention also provides a method for forming a conductive pattern by a gravure offset printing process, the method employing a gravure plate having a bezel-pattern recess to be filled with a paste, a doctor configured to fill the paste into the recess of the gravure plate, and a blanket onto which the paste is transferred from the recess of the gravure plate, the method including supplying a printing object so as to face the blanket, making the printing object and the blanket come into contact with each other by pressing to print a pattern corresponding to a fine wiring pattern on the blanket onto the printing object, and subsequently performing firing, wherein the paste is the above-described conductive paste.

Furthermore, the present invention provides a conductive-pattern-printed product formed with the above-described conductive paste.

Advantageous Effects of Invention

A conductive paste according to the present invention is prepared such that the content of non-volatile matter of the organic compound (B) relative to the total of four components of the conductive metal particles (A) to the organic solvent (D) is made lower than before and the mass ratio R/P of non-volatile matter of the organic compound (B) and the organic compound (C) to the conductive metal particles (A) is also made lower than before. Thus, printing even with a gravure plate having a complicated recess such as a bezel-pattern recess can provide an intended conductive pattern having high linearity and having no disconnection, short circuits, or the like, which is highly advantageous. In the present invention, the term "fine", though dependent on the shape of a conductive pattern to be formed, denotes, for example, image lines (thin lines) having a line width of 50 µm or less, in particular, 15 to 35 µm, which is smaller than before. A method for forming a conductive pattern according to the present invention employs the above-described specific conductive paste. Accordingly, an intended conductive pattern having high linearity and having no disconnection, short circuits, or the like and a printed product of the conductive pattern can be obtained, which is highly advantageous.

BRIEF DESCRIPTION OF DRAWING

FIG. 1 is a plan view illustrating an example of a bezel pattern, which is a fine wiring pattern obtained in the present invention.

BEST MODES FOR CARRYING OUT THE INVENTION

A conductive paste according to the present invention is a conductive paste for bezel-pattern printing performed by a gravure offset printing process, the conductive paste including conductive metal particles (A); an organic compound (B) that is solid at 50° C. and has a boiling point of more than 300° C. at normal pressure; an organic compound (C) that is liquid at 50° C. and has a boiling point of more than 300° C. at normal pressure; and an organic solvent (D) that is not the (B) or (C), does not have reactivity with the (B) or (C), and has a boiling point of 170° C. to 300° C. at normal pressure, wherein a ratio of non-volatile matter of the (B) to a total of the (A) to (D) in terms of mass is 1.0% to 3.0%, and a mass ratio R/P of a total amount R of, in terms of mass of non-volatile matter, the organic compound (B) and the organic compound (C) used to an amount P of the conductive metal particles (A) used is 0.07 to 0.15.

(Conductive Metal Particles)

The conductive metal particles (A) used in the present invention may be publicly known materials: for example, nickel, copper, gold, silver, aluminum, zinc, nickel, tin, lead, chromium, platinum, palladium, tungsten, molybdenum; alloys or mixtures each containing two or more of the foregoing, and highly conductive compounds of these metals. In particular, silver powder is preferred because stable electrical conductivity is easily achieved and the thermal conduction characteristic is also good.

(Silver Powder)

In the case of using silver powder as the conductive metal particles (B) used in the present invention, it is preferable to use a spherical silver powder having, as an average particle size, a median particle size (D50) of 0.1 to 10 µm, more preferably 0.1 to 3 µm. When such a range is satisfied, even in continuous printing performed with a printer by the gravure offset printing process, problems tend not to occur and formation of good conductive patterns with stability is facilitated.

Examples of such a silver powder include AG2-1C (manufactured by DOWA Electronics Materials Co., Ltd., average particle size D50: 0.8 µm), SPQ03S (manufactured by MITSUI MINING & SMELTING CO., LTD., average particle size D50: 0.5 µm), EHD (manufactured by MITSUI MINING & SMELTING CO., LTD., average particle size D50: 0.5 µm), Silbest C-34 (manufactured by Tokuriki Chemical Research Co., Ltd., average particle size D50: 0.35 µm), AG2-1 (manufactured by DOWA Electronics Materials Co., Ltd., average particle size D50: 1.3 µm), and Silbest AgS-050 (manufactured by Tokuriki Chemical Research Co., Ltd., average particle size D50: 1.4 µm).

The conductive metal particles (A) may be particles having exposed metal surfaces without any surface coating; particles having been surface-coated with, for example, various fatty acids, salts thereof, or polar or nonpolar surfactants; or particles on portions of metal surfaces of which metal oxide is present.

A conductive paste according to the present invention contains, as non-volatile organic compound components, the organic compound (B) component that is solid at 50° C. and the organic compound (C) component that is liquid at 50° C. These organic compound components become integrated to form a dry film after printing and fix the conductive metal particles (A) on a printing object described below.

(Organic Compound that is Solid at 25° C. and has a Boiling Point of More than 300° C. at Normal Pressure)

The organic compound (B) used in a conductive paste according to the present invention is solid at 50° C. and has a boiling point of more than 300° C. at normal pressure. The organic compound (B) allows formation of a good film from the organic compound alone, allows formation of a good film on a blanket described below, and allows complete transfer of the paste film from the blanket to a printing object. The organic compound (B) is solid at 50° C., has a boiling point of more than 300° C. at normal pressure, is preferably soluble in the organic solvent (D) described below, and preferably melts and becomes highly flowable at a firing temperature or less.

Examples of the organic compound (B) include various synthetic resins: polyesters; polyvinyl chloride, copolymers of vinyl chloride and other unsaturated double-bond-containing monomers; homopolymers of (meth)acrylates, copolymers of (meth)acrylates and other unsaturated double-bond-containing monomers; polystyrene, copolymers of a styrene monomer and other unsaturated double-bond-containing monomers; ketone-formaldehyde condensation products, hydrogenated products thereof; polyfunctional epoxy resins; polyvinyl acetals; and polyurethane. These compounds may be used alone or in combination of one or more thereof. Examples of the polyfunctional epoxy compounds include bisphenol A novolac epoxy resins, bisphenol F novolac epoxy resins, bisphenol S novolac epoxy resins, biphenyl epoxy resins, and naphthalene epoxy resins.

In a case where the printing object is formed of, for example, polyethylene terephthalate (PET), the organic compound (B) is preferably at least one thermoplastic resin that is solid at 50° C. and is selected from the group consisting of ketone-formaldehyde condensation products, hydrogenated products thereof, polyesters, vinyl chloride-vinyl acetate copolymers, and polyvinyl acetals, which themselves exhibit high adhesion to PET. Examples of the ketone-formaldehyde condensation products and hydrogenated products thereof include TEGO (registered trademark) VariPlus series (SK, AP, and the like) from Evonik Degussa Japan Co., Ltd. Examples of the polyesters include VYLON (registered trademark) series (VYLON 200 and the like) manufactured by TOYOBO CO., LTD. Examples of the vinyl chloride-vinyl acetate copolymers include Solbin (registered trademark) series (Solbin AL and the like) manufactured by Nissin Chemical Industry Co., Ltd. Examples of the polyvinyl acetals include S-LEC (registered trademark) series (S-LEC KS-10 and the like) manufactured by SEKISUI CHEMICAL CO., LTD.

The organic compound (B), which is itself solid at 50° C., obviously does not necessarily react to form a covalent bond with the organic compound (C) described below, which is liquid at 50° C. and has a boiling point of more than 300° C. at normal pressure. However, for the purpose of forming a covalent bond in such a reaction, the organic compound (B) preferably has a functional group that can react with the organic compound (C) described below, which is liquid at 50° C. and has a boiling point of more than 300° C. at normal pressure, from the viewpoint of fixing of conductive patterns to printing objects and heat resistance.

In particular, the organic compound (B) having a functional group that can react with the organic compound (C) may be a hydroxy-group-containing thermoplastic resin and/or a polyfunctional epoxy compound; in particular, preferably used is at least one hydroxy-group-containing thermoplastic resin selected from the group consisting of hydrogenated products of ketone-formaldehyde condensation products, hydroxy-group-containing polyesters, hydroxy-group-containing vinyl chloride-vinyl acetate copolymers, hydroxy-group-containing styrene-based resins, hydroxy-group-containing acrylic resins, and hydroxy-group-containing polyvinyl acetals.

The ratio of non-volatile matter of the organic compound (B) to the total of the components (A) to (D) in terms of mass is 1.0% to 3.0%. This has been found by the inventor of the present invention and is an indispensable technical requirement during printing of a bezel pattern by the gravure offset printing process. In general, it is considered that the content of non-volatile matter of the organic compound (B) is preferably 2% to 20%; however, this is merely a range suitable for cases where printing is performed with gravure plates having linear recesses only. In printing of bezel patterns, which typically have a shape constituted by two intersecting straight lines such as a general L shape or a general inverted L shape or have a shape constituted by a pair of these shapes, a content of the non-volatile matter out of the above-described range is difficult to provide such high printing suitability as in the present invention. When the content is 1% by mass or more, a good bezel-pattern conductive paste film is easily formed on a blanket and complete transfer of the conductive paste film from the blanket to a printing object is easily achieved. When the content is 3% by mass or less, the paste has a more appropriate viscosity and the step of supplying the conductive paste to a gravure plate having a bezel-shaped conductive pattern is easily performed.

(Organic Compound that is Liquid at 50° C. and has a Boiling Point of More than 300° C. at Normal Pressure)

The organic compound (C) used in a conductive paste according to the present invention is liquid at 50° C. and has a boiling point of more than 300° C. at normal pressure. In particular, the organic compound (C) is liquid at 50° C., has a boiling point of more than 300° C. at normal pressure, is preferably soluble in the organic solvent (D) described below, and is preferably highly flowable.

Examples of such compounds include various organic compounds: polyfunctional epoxy compounds, high-molecular-weight polyol compounds, oxetane compounds, vinyl ether compounds, polyisocyanate compounds, and blocked polyisocyanate compounds. These compounds may be used alone or in combination of one or more thereof.

Examples of the polyfunctional epoxy compounds include 1,4-butanediol diglycidyl ether, cyclohexanedimethanol diglycidyl ether, trimethylolpropane diglycidyl ether, 3',4'-epoxycyclohexylmethyl-3,4-epoxycyclohexane carboxylate, trimethylolpropane triglycidyl ether, and tris(hydroxyphenyl)methane triglycidyl ether. Examples of the high-molecular-weight polyol compounds include polyester polyols, polyether polyols, polycarbonate polyols, and polycaprolactone polyols that are publicly known and commonly used and have a molecular weight of 800 or more. Examples of the oxetane compounds include 3-ethyl-3{[(3-ethyloxetan-3-yl)methoxy]methyl}oxetane.

If necessary, the following curing agents (curing catalysts) for polyfunctional epoxy compounds may be used: for example, publicly known and commonly used acid anhydrides, amines, imidazoles, and phenol resins.

Examples of the polyisocyanate compounds include aromatic, aliphatic, or alicyclic diisocyanates, dimers or trimers formed by modification of diisocyanates, and terminal-isocyanate-group-containing compounds. These compounds may be used alone or in combination. Examples of the aromatic diisocyanates include 2,4-tolylene diisocyanate, 2,6-tolylene diisocyanate, diphenylmethane-4,4'-diisocyanate, diphenylmethane-2,4'-diisocyanate, dianisidine diisocyanate, m-xylylene diisocyanate, and p-xylylene diisocyanate. Examples of the aliphatic diisocyanates include 1,4-tetramethylene diisocyanate, 1,5-pentamethylene diisocyanate, 1,6-hexamethylene diisocyanate, 2,2,4-trimethyl-1,6-hexamethylene diisocyanate, and lysine diisocyanate. Examples of the alicyclic diisocyanates include isophorone diisocyanate, 1,3-bis(isocyanatomethyl)cyclohexane, 4,4'-dicyclohexylmethane diisocyanate, and norbornane diisocyanate. Furthermore, dimers or trimers formed by modification of such diisocyanates may be used.

The modification may be performed by, for example, formation of biuret or formation of isocyanurate. For example, terminal-isocyanate-group-containing compounds may be used that are prepared by reactions between the above-described di- or polyisocyanate compounds and active hydrogen compounds such as ethylene glycol, propylene glycol, trimethylolpropane, polyester polyol, polyether polyol, and polyamide.

From the viewpoint of fixing of conductive patterns to printing objects and heat resistance, the organic compound (C) preferably has a functional group that can react with the organic compound (B) for the purpose of causing heat curing through formation of a covalent bond in a firing step after printing; or, in the case of employing two or more organic compounds (C) that are liquid at 50° C. and have a boiling point of more than 300° C. at normal temperature, these compounds each preferably have a functional group that can react. Such an organic compound (C) that is liquid at 50° C. becomes solid at 50° C. as a result of integration in the above-described reaction. This provides fixing (sometimes referred to as bonding or adhesion) of a conductive pattern and heat resistance.

Polyisocyanate compounds that have exposed isocyanato groups (free isocyanato groups) absorb moisture or, in the presence of an organic compound having a hydroxy group, undergo a urethane formation reaction over time. Accordingly, the conductive paste needs to be used immediately after preparation thereof.

For this reason, in order to cause a reaction on a desired occasion, what is called a blocked polyisocyanate compound in which free isocyanato groups are blocked with a blocking agent is preferably used. As described below, in the case where a heat-curing system is employed as an organic-compound combination of the organic compound (B) and the organic compound (C) or an organic-compound combination of two or more organic compounds (C), for example, a blocked polyisocyanate compound and an organic compound having a functional group that can react with a free isocyanato group can be used. As a result, the storage stability of the conductive paste can be enhanced; and heating on a desired occasion after preparation causes dissociation of the blocking agent, to thereby cause a reaction between the compounds.

Such a blocked polyisocyanate compound is liquid at 50° C. and a polyisocyanate compound generated as a result of dissociation of the blocking agent by heating at 300° C. or less has a boiling point of more than 300° C. at normal pressure. Accordingly, the blocked polyisocyanate compound is classified into the organic compound (C) in the present invention.

Examples of the blocking agent include publicly known and commonly used blocking agents such as phenol, methyl ethyl ketoxime, and sodium bisulfite. In the cases where a conductive pattern formed from a conductive paste according to the present invention is formed on a heat-resistant substrate composed of glass, metal, silica, ceramic, or the like, any of these blocking agents can be used. In the cases where such a conductive pattern is formed on a non-heat-resistant substrate such as a PET film or a transparent ITO electrode film, preferably used is a blocked polyisocyanate compound in which a blocking agent is dissociated at a lower temperature to provide free isocyanato groups. In particular, in a case where a PET film, which is a plastic film, is used as a substrate, a conductive paste can be made to contain a blocked polyisocyanate compound employing such a blocking agent that isocyanato groups are generated at a temperature of 70° C. to 125° C. As a result, without causing warpage or the like of the PET film, a conductive pattern can be formed on the PET film.

Such a blocking agent that can be dissociated at a lower temperature may be an active methylene compound or a pyrazole compound. Examples of the active methylene compound include Meldrum's acid, dialkyl malonate, alkyl acetoacetate, 2-acetoacetoxyethyl methacrylate, acetylacetone, and ethyl cyanoacetate. Examples of the pyrazole compound include pyrazole, 3,5-dimethylpyrazole, 3-methylpyrazole, 4-benzyl-3,5-dimethylpyrazole, 4-nitro-3,5-dimethylpyrazole, 4-bromo-3,5-dimethylpyrazole, and 3-methyl-5-phenylpyrazole. In particular, for example, diethyl malonate and 3,5-dimethylpyrazole are preferred.

A blocked polyisocyanate compound in which a blocking agent is dissociated by heat to provide free isocyanato groups can be easily obtained in the following manner: a polyisocyanate compound having free isocyanato groups is made to react with a blocking agent under monitoring of an infrared absorption spectrum until the unique absorption spectrum based on isocyanato groups disappears.

Preferred examples of commercially available products of blocked polyisocyanates are as follows. Products in which the blocking agent is an active methylene compound include Duranate (registered trademark) MF-K60B (manufactured by Asahi Kasei Chemicals Corporation) and Desmodur (registered trademark) BL-3475 (manufactured by Sumika Bayer Urethane Co., Ltd.). A product in which the blocking agent is a pyrazole compound is TRIXENE BI-7982 (manufactured by Baxenden Chemicals Ltd.). A product in which the blocking agent is a mixture of an active methylene compound and a pyrazole compound is TRIXENE BI-7992 (manufactured by Baxenden Chemicals Ltd.).

In order to provide the above-described change of the state on a printing object by the reaction and a higher strength of fixing of a printed pattern constituted by the resultant film to the printing object, specifically, the organic compound (C) is preferably a blocked polyisocyanate compound and a polyfunctional epoxy compound and/or a high-molecular-weight polyol.

Regarding a conductive paste according to the present invention that exhibits conductivity as a result of firing, the curing system of forming a covalent bond between the organic compound (B) and the organic compound (C) or between two or more organic compounds (C) is preferably a heat-curing system rather than curing systems using active energy rays such as ultraviolet rays or electron beams. The conductive metal particles (A) themselves substantially do not transmit active energy rays. Accordingly, active energy rays applied to a film formed of a paste containing the conductive metal particles (A) and the organic compounds (B) and (C) merely cure the surface without reaching a deep portion in the film-thickness direction. Thus, it is difficult to sufficiently cure the deep portion of the film. On the other hand, in the case of performing curing by heat, energy necessary for the curing reaches the deep portion in the film-thickness direction.

For convenience, a heat-curable conductive paste includes a combination of a main component that does not cure alone and a curing agent (curing catalyst). The main component and the curing agent (catalyst) are individually selected such that a mixture thereof does not react at room temperature and cures upon heating. The main component and the curing agent can be selected from the above-described organic compound (B) and organic compound (C).

Such a heat-curable conductive paste may include, for example, a combination of a polyfunctional epoxy compound as the organic compound (B) or the organic compound (C) and the above-described curing agent (curing catalyst); or a combination of the organic compound (B) that is a hydroxy-group-containing film-formable thermoplastic resin such as a hydroxy-group-containing vinyl chloride-vinyl acetate copolymer, a hydroxy-group-containing polyester resin, or a hydroxy-group-containing acrylic resin and the organic compound (C) that is a blocked polyisocyanate compound. Alternatively, it is obvious that a conductive paste according to the present invention may be prepared by combining the organic compound (B) that is the above-described hydroxy-group-containing film-formable thermoplastic resin and the organic compounds (C) that are a polyfunctional epoxy compound and a blocked polyisocyanate compound.

In particular, preferred is the combination of a blocked polyisocyanate compound and a hydroxy-group-containing film-formable thermoplastic resin. This is because high dispersibility of the conductive metal particles (A) is provided and the paste can have a higher content of the conductive metal particles (A); as a result, conductivity can be further increased and high adhesion to a printing object upon curing is achieved. This adhesion is highly advantageous in that, in the case where a printing object on which a conductive pattern is formed is a flexible non-heat-resistant material, an electric-electronic component having a conductive circuit has enhanced bendability and a high degree of integration can be achieved.

In a heat-curable conductive paste having, as an essential component, a combination of a hydroxy-group-containing film-formable thermoplastic resin and an isocyanate curing agent such as a blocked polyisocyanate compound, the content of non-volatile matter of the hydroxy-group-containing film-formable thermoplastic resin is preferably 5 to 50 parts in terms of mass relative to 100 parts of non-volatile matter of the polyisocyanate compound excluding the blocking agent. This is because high printing suitability is achieved.

If necessary, a blocked polyisocyanate compound used in the present invention may be used in combination with a curing catalyst. The curing catalyst is not particularly limited but is preferably an organic ammonium salt or an organic amidine salt. Specific examples of the organic ammonium salt include tetraalkyl ammonium halides, tetraalkyl ammonium hydroxides, and tetraalkyl ammonium organic acid salts. Specific examples of the organic amidine salt include phenol salts, octylic acid salts, oleic acid salts, p-toluenesulfonic acid salts, and formic acid salts of 1,8-diazabicyclo [5.4.0]undec-7-ene (hereafter DBU) and 1,5-diazabicyclo [4.3.0]non-5-ene (hereafter DBN). In particular, for example, preferably used are a DBU-phenol salt, a DBU-octylic acid salt, and a DBN-octylic acid salt. An example of a commercially available product of an organic ammonium salt is TOYOCAT-TR20 (manufactured by Tosoh Corporation). Examples of a commercially available product of an organic amidine salt include U-CAT SA1, U-CAT SA102, U-CAT SA106, U-CAT SA506, U-CAT SA603, and U-CAT SA1102 (manufactured by San-Apro Ltd.). An organic ammonium salt or an organic amidine salt functions not only as a catalyst for dissociation of the blocking agent of a blocked polyisocyanate compound but also as a ring-opening catalyst for epoxy groups of the above-described polyfunctional epoxy compounds.

The content of a reaction catalyst of the blocked polyisocyanate compound is preferably 3 to 30 parts in terms of mass relative to 100 parts of the blocked polyisocyanate compound. This is because the performance of the finally obtained conductive pattern such as conductivity or solvent resistance can be enhanced.

In a conductive paste according to the present invention, the ratio of the conductive metal particles (A) to the organic compound (B) and the organic compound (C) is not particularly limited. However, the conductive paste is preferably prepared such that a mass ratio R/P of the total amount R of, in terms of mass of non-volatile matter, the organic compound (B) and the organic compound (C) used to the amount P of the conductive metal particles (A) used is 0.07 to 0.15 from the viewpoint of the conductivity of the conductive pattern to be obtained.

In a conductive paste according to the present invention, in the case where a heat-curing system is employed as an organic-compound combination of two or more organic compounds (C), even when the organic compound (B) is contained, the amounts of non-volatile matter of the two or more organic compounds (C) used may be selected such that all the functional groups that can react in the organic compounds (C) alone are assumed to be consumed and the equivalents of the organic compounds (C) become stoichiometrically the same.

However, in the case where a heat-curing system is employed as an organic-compound combination of the organic compound (B) and the organic compound (C) or an organic-compound combination of the organic compound (B) and two or more organic compounds (C), the amounts of non-volatile matter of the organic compound (B) and the organic compounds (C) used are preferably selected such that all the functional groups that can react in the organic compound (B) and the organic compounds (C) are consumed and the equivalents of the organic compound (B) and the organic compounds (C) become stoichiometrically the same.

There may be a case where the amounts of non-volatile matter of the organic compound (B) and the organic compounds (C) used are selected such that the amounts of functional groups are stoichiometrically equivalent, and a reaction does not sufficiently occur due to the reaction rate. In such a case, obviously, the amounts of non-volatile matter of the organic compounds used may be increased or decreased with respect to the equivalent such that the reaction rate of the reaction is maximized.

A gravure offset printing process used in the present invention employs a gravure plate having a recess corresponding to a desired printed pattern, a doctor configured to fill a paste into the recess of the gravure plate, and a blanket having a surface formed of, for example, silicone rubber. In this gravure plate, a groove is formed so as to have a recess that corresponds to a bezel pattern and is to be filled with a conductive paste. The conductive paste is transferred from the recess of the groove of the gravure plate to the blanket. A printing object is supplied so as to face the blanket and the printing object and the blanket are made to come into contact with each other by pressing to print a pattern corresponding to a fine wiring pattern on the blanket onto the printing object. Thus, a printed pattern is formed. This printed pattern is fired to thereby become a fine wiring pattern having conductivity (conductive pattern).

In other words, the steps of gravure offset printing roughly include a doctoring step of filling a conductive paste into a recess of a groove of a gravure plate; an off step of transferring the conductive paste filled into the recess onto the surface of a blanket; and a set step of transferring the conductive paste having been moved to the blanket, onto a printing object. This printing process allows free setting of the shape of a printed pattern by using the shape of the recess. In addition, the transfer ratio of the conductive paste from the blanket onto a printing object is also high. Accordingly, a printed pattern corresponding to a fine wiring pattern can be formed with high accuracy.

The gravure offset printing process can employ publicly known and commonly used intaglio plates; intaglio plates each formed by exposure, development, and washing of a photosensitive resin on a glass plate; and intaglio plates each formed by subjecting a glass plate, a metal plate, or a metal roll to chemical etching and laser etching.

The gravure plate may be a plate having a recess equivalent to a groove corresponding to a bezel pattern having publicly known and commonly used line width and depth. However, preferably used is a gravure plate having a recess having a line width of 10 to 50 μm and a depth of 5 to 20 μm and corresponding to a bezel pattern. This is because high linearity can be ensured even in a larger amount of printing of a wiring pattern having a higher density and disadvantages such as disconnection are not observed.

In the gravure offset printing process, sheet-shaped printing objects, a flat plate serving as the gravure plate, and a cylindrical blanket serving as the blanket may be used; and the blanket may be pressed onto the printing objects to perform transfer printing of the pattern on the blanket onto the printing objects. Alternatively, a long printing object wound into a roll, a cylindrical plate serving as the gravure plate, a cylindrical blanket serving as the blanket, and a press cylinder may be used; and the blanket may be pressed onto the printing object to continuously perform transfer printing of the pattern on the blanket onto the printing object.

In the off step of transferring a conductive paste filling a recess onto the surface of a blanket, the organic solvent (D) contained in the conductive paste is absorbed by the blanket and the content of non-volatile matter increases; and this conductive paste is transferred onto a printing object in the set step. Thus, every time the printing cycle is repeated, the organic solvent (D) contained in the conductive paste accumulates in the blanket. The volume of the organic solvent (D) that the blanket can absorb naturally has a limit. Accordingly, beyond this limit, transfer to a printing object is not appropriately performed in the set step and disadvantages such as distortion of the printed pattern may occur. For this reason, in the case where a large amount of printing is performed with a single blanket, after printing on a printing object, a step of drying the blanket having absorbed the organic solvent (D) is preferably performed. This drying step may be performed every single printing cycle or may be performed once every several, 5 to 20, printing cycles.

In the present invention, the ratio of non-volatile matter of the organic compound (B) to the total of the (A) to (D) in terms of mass is 1.0% to 3.0%, and the mass ratio R/P of the total amount R of, in terms of mass of non-volatile matter, the organic compound (B) and the organic compound (C) used to the amount P of the conductive metal particles (A) used is 0.07 to 0.15. As a result, a bezel-pattern printing can be unprecedentedly performed such that a fine wiring pattern having high conductivity can be formed without causing disadvantages such as pinholes, disconnection, or short circuits.

(Organic Solvent that is not the (B) or (C), does not have Reactivity with the (B) or (C), and has a Boiling Point of 170° C. to 300° C. at Normal Pressure)

In order to achieve suitability for the gravure offset printing process, normally, it is necessary that the organic compound (B) and the organic compound (C) used in the present invention are dissolved in a solvent and the conductive metal particles (A) are dispersed in the resultant mixture to form a paste; and a fine line pattern of the conductive paste is applied to or printed on a printing object. For this reason, in the selection of a main component and a curing agent that constitute a heat-curable conductive paste, solubility in a solvent is preferably considered.

From such a viewpoint, as the above-described solvent, the organic solvent (D) is used that is not the (B) or (C), does not have reactivity with the (B) or (C), and has a boiling point of 170° C. to 300° C. at normal pressure. The organic solvent (D) may be any publicly known and commonly used organic solvent that satisfies the above-described conditions. The organic solvent (D) may be used alone or in combination of two or more thereof.

The gravure offset printing process employs a blanket. The blanket is, for example, a sheet having a layer structure including a silicone rubber layer, a PET layer, and a sponge layer. Normally, the blanket is used in the state of being wound around a rigid cylinder referred to as a blanket cylinder.

The gravure offset printing process employs a blanket. The blanket is, for example, a sheet having a layer structure including a silicone rubber layer, a PET layer, and a sponge layer. Normally, the blanket is used in the state of being wound around a rigid cylinder referred to as a blanket cylinder.

The present invention employs a gravure offset printing process. For this reason, the organic solvent (D) is preferably an organic solvent that has a blanket swelling ratio of 5% to 20%. Examples of such an organic solvent are described in Tables below.

In Tables, the boiling point denotes a boiling point at normal pressure; and the blanket swelling ratio is determined in the following manner. A blanket is cut into squares having 2 cm sides, measured, and immersed in various organic solvents; after the lapse of an hour, the blanket is withdrawn from the organic solvents, measured again; and a weight increase ratio between before and after the immersion is determined.

TABLE 1

| Abbreviation | Boiling point (° C.) | Blanket swelling ratio (%) | Chemical name |
|---|---|---|---|
| TPNB | 274 | 15.2 | tripropylene glycol n-butyl ether |
| BDGAC | 247 | 11.0 | diethylene glycol monobutyl ether acetate |
| TPM | 242 | 7.1 | tripropylene glycol methyl ether |
| EDGAC | 217 | 6.9 | diethylene glycol monoethyl ether acetate |
| methyltriglyme | 216 | 9.3 | triethylene glycol dimethyl ether |
| DPMA | 213 | 7.7 | dipropylene glycol methyl ether acetate |
| DBE *1 | 211 | 5.3 | dibasic acid ester |
| KYOWANOL HX *2 | 208 | 11.5 | ethylene glycol monohexyl ether |
| Hisolve DPM *3 | 190 | 7.5 | dipropylene glycol methyl ether |

*1) Product name of SANKYO CHEMICAL CO., LTD.
*2) Product name of KH Neochem Co., Ltd.
*3) Product name of TOHO CHEMICAL INDUSTRY Co., Ltd.

TABLE 2

| Abbreviation | Boiling point (° C.) | Blanket swelling ratio (%) | Chemical name |
|---|---|---|---|
| PGDA | 190 | 7.1 | propylene glycol diacetate |
| SOLFIT *4 | 174 | 5.3 | 3-methoxy-3-methylbutanol |

TABLE 2-continued

| Abbreviation | Boiling point (° C.) | Blanket swelling ratio (%) | Chemical name |
|---|---|---|---|
| BMG (butyl cellosolve) | 171 | 11.7 | ethylene glycol monobutyl ether |
| MMGAC | 145 | 11.0 | ethylene glycol monomethyl ether acetate |

*4) Registered trademark, product name of KURARAY CO., LTD.

Of the above-described organic solvents (D), preferred are, for example, propylene glycol diacetate (PDGA) and 3-methoxy-3-methylbutanol (SOLFIT) because printed patterns having high linearity and a low probability of occurrence of disconnection or the like can be obtained both upon initial printing of a bezel pattern and upon performing of a larger amount of printing. In particular, preferred are, for example, diethylene glycol monobutyl ether acetate (BDGAC), diethylene glycol monoethyl ether acetate (EDGAC), triethylene glycol dimethyl ether (methyltriglyme), and dibasic acid ester (DBE) because printed patterns having high linearity and a low probability of occurrence of disconnection or the like can be obtained, rather than upon initial printing of a bezel pattern, upon performing of a larger amount of printing of the bezel pattern.

The content of the organic solvent (D) in a conductive paste according to the present invention is not particularly limited as long as the above-described advantages can be obtained in the gravure offset printing process; however, the content is preferably 5% to 30% by mass, more preferably 7% to 15% by mass. When such a range is satisfied, the paste has a more appropriate viscosity; and, in particular, gravure offset printing can be performed to form finer printed patterns without causing pinhole defects in corner portions or intersections of a matrix of image lines.

A conductive paste according to the present invention, which contains the above-described publicly known and commonly used raw material components, may further contain an organic compound having at least one functional group selected from the group consisting of a phosphoric acid group, phosphate groups, and phosphoric ester groups.

In the case where the above-described gravure offset printing process is employed to form a conductive pattern from a conductive paste, the blanket needs to allow transfer from an intaglio plate and transfer to printing objects. In order to sufficiently achieve transfer to printing objects, the surface of the blanket needs to absorb a certain proportion of the liquid component of the conductive paste. Insufficient absorption tends to cause delamination of a conductive paste layer upon transfer to a printing object. Conversely, absorption beyond a certain proportion results in drying of the conductive paste on the surface of the blanket and defects of transfer to printing objects tend to be caused.

In particular, a conductive paste used for gravure offset printing for printing a bezel pattern preferably has a paste viscosity of 100 Pa·s or less at a shear rate of 1 s$^{-1}$ and a paste viscosity of 2.0 to 5.0 Pa·s at a shear rate of 100 s$^{-1}$ in order to obtain the above-described printed pattern having high linearity and having no defects such as disconnection. The paste viscosities can be adjusted to satisfy such preferred values only by selection from the above-described publicly known and commonly used raw material components. However, this adjustment is facilitated by further using an organic compound having at least one functional group selected from the group consisting of a phosphoric acid group, phosphate groups, and phosphoric ester groups.

In the present invention, the organic compound (B) and the organic compound (C) are defined as not encompassing organic compounds having at least one functional group selected from the group consisting of a phosphoric acid group, phosphate groups, and phosphoric ester groups.

The phosphoric acid group is a group represented by —$H_2PO_4$ (the P atom has a valence of 5). The phosphate groups denote groups in which at least one hydrogen atom in —$H_2PO_4$ is replaced by alkali metal ions or alkaline-earth metal ions to form a salt. The phosphoric ester groups denote groups in which at least one hydrogen atom in —$H_2PO_4$ is replaced by an alkyl group or a phenyl group. Hereafter, organic compounds containing a phosphoric acid group, organic compounds containing phosphate groups, and organic compounds containing phosphoric ester groups are collectively abbreviated as phosphoric-acid-group-containing organic compounds.

Examples of such organic compounds containing a phosphoric acid group include low-molecular-weight compounds such as polyalkylene glycol monophosphates, polyalkylene glycol monoalkyl ether monophosphates, perfluoroalkyl polyoxyalkylene phosphates, and perfluoroalkyl sulfonamide polyoxyalkylene phosphates; and high-molecular-weight compounds that are phosphoric-acid-group-containing polymers such as homopolymers of vinylphosphonic acid, acid phosphooxyethyl mono(meth)acrylate, acid phosphooxypropyl mono(meth)acrylate, or acid phosphooxy polyoxyalkylene glycol mono(meth)acrylate, and copolymers of such monomers and other comonomers.

The above description includes only specific examples of organic compounds containing a phosphoric acid group. Organic compounds containing phosphate groups can be easily obtained by making such organic compounds containing a phosphoric acid group react with alkali metal hydroxides or alkaline-earth metal hydroxides. Organic compounds containing phosphoric ester groups can also be easily obtained by dehydration condensation between organic compounds containing a phosphochloride group and alcohols.

Of the phosphoric-acid-group-containing organic compounds, organic compounds containing a phosphoric acid group and organic compounds containing phosphate groups are more preferable than organic compounds containing phosphoric ester groups because, in terms of use of the same amount of non-volatile matter, a lower viscosity and a lower volume resistivity can be achieved.

The above-described low-molecular-weight compounds to be used can be selected from, for example, EFKA series manufactured by Ciba Specialty Chemicals and PLYSURF series manufactured by DAI-ICHI KOGYO SEIYAKU CO., LTD. On the other hand, the high-molecular-weight compounds to be used can be selected from, for example, DISPERBYK (registered trademark) series manufactured by BYK Japan KK.

The high-molecular-weight compounds are preferably phosphoric-acid-group-containing polymers having a number-average molecular weight of 1,000 or more, in particular, a number-average molecular weight of 1,000 to 10,000. This is because, compared with the above-described low-molecular-weight compounds in the same amount, a strong effect of improving the fluidity of a conductive ink composition is provided without decreasing conductivity.

The amount of a phosphoric-acid-group-containing organic compound used in the present invention is preferably 0.1 to 3 parts relative to 100 parts of the total of the conductive metal particles (A), the organic compound (B), the organic compound (C), and the organic solvent (D) in terms of mass.

If necessary, a conductive paste according to the present invention, which contains the above-described components, may appropriately contain various additives such as a dispersing agent, a defoaming agent, a release agent, a leveling agent, and a plasticizer in appropriate amounts.

A conductive paste according to the present invention may be applied or printed by a desired method on a printing object such as a plastic film, a ceramic film, a silicon wafer, or a glass or metal plate to thereby form a printed pattern. However, advantages of a conductive paste according to the present invention are fully provided in the case of using, during formation of a conductive pattern, a printing object that cannot be subjected to high temperature, that is, a PET film or a transparent conductive film such as an ITO film on a PET film serving as a support.

In the case of printing with a conductive paste according to the present invention on a printing object having low heat resistance such as a plastic film, the conductive paste is preferably prepared so as not to contain an inorganic binder, such as glass frit, the inorganic binder melting at a temperature equal to or more than the decomposition temperature of the organic compound (B) and less than the melting point of the conductive metal particles (A) to thereby make the conductive metal particles (A) bond to the printing object. A conductive paste according to the present invention is intended to fix the conductive metal particles (A) to a printing object mainly by the organic compound (B) and the organic compound (C). Accordingly, it is not preferred that the presence of the inorganic binder in the paste results in a decrease in the content of the conductive metal particles (A), so that high conductivity provided by the conductive metal particles (A) is difficult to achieve and the strength of fixing to the printing object becomes low.

A printed pattern that is formed on a printing object by the gravure offset printing and corresponds to a fine wiring pattern including a bezel pattern, is fired to thereby obtain a conductive fine wiring pattern. During this firing, removal of the organic solvent (D) contained in the paste and a curing reaction of the organic compound (B) and the organic compound (C) may be performed in this order or may be performed simultaneously.

In order to remove the organic solvent (D) and to cause a curing reaction of an organic-compound combination of the organic compound (B) and the organic compound (C) or an organic-compound combination of the organic compound (B) and two or more organic compounds (C), publicly known and commonly used techniques can be employed: heating with a heat source, irradiation with a xenon flash lamp, irradiation with microwaves, irradiation with near-infrared rays, irradiation with far-infrared rays, and irradiation with microwaves. In the case of using a printing object that cannot be subjected to high temperature, that is, a PET film or a transparent conductive film such as an ITO film on a PET film serving as a support, paste raw materials are preferably selected so as to cause the curing reaction at 150° C. or less and firing is preferably performed at 150° C. or less.

In the case of using a highly heat-resistant printing object formed of glass or the like as a printing object, curing at a relatively high temperature can be performed. Accordingly, regarding an organic-compound combination of the organic compound (B) and the organic compound (C) or an organic-compound combination of the organic compound (B) and two or more organic compounds (C), a conductive paste according to the present invention may be a heat-curable conductive paste containing a polyfunctional epoxy compound serving as the organic compound (B), a polyfunctional epoxy compound serving as the organic compound (C), and a curing catalyst. However, in the case of using a printing object having low heat resistance such as a PET film, a conductive paste according to the present invention that reacts at 150° C. or less, in particular, 100° C. to 140° C. can be used: a heat-curable conductive paste containing a hydroxy-group-containing film-formable thermoplastic resin serving as the organic compound (B); a polyfunctional epoxy compound serving as one or both of the organic compound (B) and the organic compound (C); a blocked polyisocyanate compound employing an active methylene compound or a pyrazole compound as a blocking agent and serving as the organic compound (C); and, if necessary, a curing catalyst.

A conductive paste according to the present invention contains the organic solvent (D). In the doctoring step, the paste is formed into a thin film and evaporation of the organic solvent (D) from the surface of this film proceeds even at temperatures less than the boiling temperature; in addition, in the subsequent off step, the blanket further absorbs the organic solvent (D) from a printed pattern having been transferred from a gravure plate. Thus, the content of the organic solvent (D) in the printed pattern having been transferred from the blanket to a printing object in the set step is considerably lower than that in the paste prior to the doctoring step. Accordingly, the organic solvent (D) can be removed without heating at a temperature equal to or more than the boiling point of the organic solvent (D) contained in the actually used conductive paste.

Thus, on a printing object, a printed pattern formed of a heat-curable conductive paste preferred in the present invention is heated, for example, at 100° C. to 140° C. for 30 to 5 minutes to become a cured film. Thus, a conductive pattern having conductivity is provided.

As described above, a conductive pattern formed from a conductive paste preferred in the present invention can be formed at a lower temperature in a shorter time than before. Accordingly, advantages of a conductive paste preferred in the present invention are considerably provided in the case of forming a conductive pattern on a non-heat-resistant printing object that has lower heat resistance and tends to deform by heat rather than on a highly heat resistant printing object such as a ceramic film or a glass or metal plate. Thus, a conductive pattern that is a cured film of a conductive paste preferred in the present invention on a non-heat-resistant printing object can be suitably used as a conductive circuit formed on the non-heat-resistant printing object.

Thus, various printing objects on which conductive fine wiring patterns including a bezel pattern are formed from a conductive paste according to the present invention by a gravure offset printing process, can be further subjected to, if necessary, wiring or the like of the conductive circuits. Thus, various electric components or electronic components can be provided. A conductive fine wiring pattern formed from a conductive paste according to the present invention also exhibits high adhesion to transparent conductive films such as transparent ITO electrodes.

A fine wiring pattern formed from a conductive paste according to the present invention on a printing object may be, for example, what is called a bezel pattern 1 having an electrode portion and a wiring portion and formed along the peripheral portion of the display area of a touch panel.

The bezel pattern 1 is, for example, a combination of a transparent electrode and fine lines connected thereto. For example, as illustrated in FIG. 1, the bezel pattern 1 includes a pair of generally L-shaped wiring patterns 4,4 each having a first fine line pattern 2 extending in a predetermined direction and a second fine line pattern 3 extending from an end of the first fine line pattern 2 in a direction substantially orthogonal to the first fine line pattern 2. A tip portion of the second fine line pattern 3 has an electrode pattern 5 constituted by a plurality of fine lines extending in a direction opposite to the first fine line pattern 2. The pair of generally L-shaped wiring patterns 4,4 is disposed such that the electrode patterns 5,5 face each other with a predetermined gap therebetween, and the first fine line patterns 2,2 are parallel to each other. The first fine line pattern 2 and the second fine line pattern 3 may have a line width of, for example, 10 μm to 100 μm. The electrode pattern 5 can be formed so as to constitute, for example, a generally rectangular region having a width of about 200 μm and a length of about 2000 μm. In FIG. 1, in the case of performing printing in the vertical direction, the first fine line patterns 2,2 are fine lines extending in the machine direction (MD); on the other hand, the second fine line patterns 3,3 orthogonal to the first fine line patterns 2,2 are fine lines extending in the transverse direction (TD).

A conductive paste according to the present invention, which can be used for formation of bezel patterns constituted by two or more linear recesses connected together so as to have a general L shape, a general inverted L shape, a combination thereof, a general square-frame shape, or the like, can also be used for formation of existing linear patterns. A conductive paste according to the present invention has eliminated the necessity of preparing two or more conductive pastes having different properties individually optimal for formation of simple linear patterns and for formation of complicated patterns such as intersections of the linear patterns and the necessity of using one of these pastes in accordance with the degree of complicatedness of the pattern to be printed, which is cumbersome. Thus, a single conductive paste according to the present invention allows even formation of a combination of a complicated bezel pattern and other simple linear patterns by a single printing process.

Examples of final products include lead electrodes of touch panels, lead electrodes of displays, electronic paper, solar cells, and other wiring components.

EXAMPLES

Hereinafter, the present invention will be specifically described with reference to examples. Herein, "%" denotes "% by mass" unless otherwise specified.

Raw materials were used in amounts corresponding to parts by mass in Table 1. These raw materials were sufficiently mixed to prepare conductive pastes according to the present invention serving as Examples and existing conductive pastes serving as Comparative examples.

These conductive pastes were evaluated regarding the following measurement items in terms of characteristics of the conductive pastes themselves and characteristics of conductive patterns obtained from the conductive pastes. The evaluation results are also summarized in Tables below.
(Shear Rate)

A rotational rheometer was used to measure viscosities of the conductive pastes at 25° C. at a shear rate of 1 s$^{-1}$ and at a shear rate of 100 s$^{-1}$.
(Printing Suitability)

Gravure offset printing was performed in the following manner with the conductive pastes of Examples and Comparative examples to thereby form conductive patterns including bezel patterns.

Each conductive paste was subjected to inking with a doctor blade into a flat glass intaglio plate having grooves having a line width of 30 μm and a depth of 10 μm and corresponding to the bezel pattern in FIG. 1. Subsequently, the intaglio plate was pressed onto a cylinder around which a silicone blanket was wound to thereby transfer the desired pattern onto the blanket. After that, the coating film on the blanket was pressed to and printed by transfer to an ITO film surface of a sheet-shaped transparent conductive film serving as a flat-plate printing object. Thus, a printed pattern having a line width of about 30 μm was formed. In the printed bezel pattern having a line width of about 30 μm, lines in TD (the second fine line patterns 3,3 in FIG. 1) were microscopically observed and fine line reproducibility was evaluated in accordance with criteria below as "after initial printing". The printing was repeated and, after the printing performed 100 times (100 sheets), a printed product was also evaluated as with above as "after continuous printing". Every time after the printing was performed 5 times (every 5 sheets), hot air was sent from a dryer to the silicone blanket; and, after evaporation of the organic solvent within the blanket has been confirmed, the subsequent printing was performed.

Excellent: lines have very high linearity and have no disconnection
Good: lines have high linearity and have no disconnection
Fair: lines have low linearity and have no disconnection
Poor: lines have low linearity and have disconnection
(Volume Resistivity)

A conductive paste was applied to a transparent conductive film (ITO film surface) with an applicator such that a film thickness after firing would be 4 μm. The conductive paste was fired at 125° C. for 30 minutes. This fired coating film was measured with a Loresta GP MCP-T610 (manufactured by Mitsubishi Chemical Corporation) by the four-terminal method. Volume resistivity represents the degree of conductivity. The conductive paste of Example 6 did not provide sufficient volume resistivity under the above-described firing conditions. Accordingly, this conductive paste was applied to a glass plate instead of the transparent conductive film, fired at 180° C. for 30 minutes, and then similarly evaluated in the above-described manner.

Good: 5×10$^{-4}$ Ω·cm or less
Fair: 5 to 10×10$^{-4}$ Ω·cm
Poor: 10×10$^{-4}$ Ω·cm or more

TABLE 3

|  | Raw material | Example 1 | Comparative example 1 | Comparative example 2 |
| --- | --- | --- | --- | --- |
| Conductive metal particles (A) | AG2-1C | 80 | 80 | 75 |
| Organic compound (B) | TEGO (registered trademark) VARIPLUS SK | 2.0 | 3.5 | 2.0 |

TABLE 3-continued

|  | Raw material | Example 1 | Comparative example 1 | Comparative example 2 |
|---|---|---|---|---|
| Organic compound (C) | TRIXENE BI 7982 | 6.5 | 4.5 | 9.0 |
|  | Denacol (registered trademark) EX-321 | 2.0 | 2.0 | 3.0 |
| Organic solvent (D) | BDGAC | 9.0 | 11.0 | 10.0 |
| Catalyst | U-CAT SA-102 | 0.5 | 0.5 | 0.5 |
| Non-volatile-matter content[*1] of organic compound (B) (%) |  | 2.0 | 3.5 | 2.0 |
| Ratio of non-volatile matter of organic compounds to metal particles R/P[*2] |  | 0.11 | 0.12 | 0.16 |
| Viscosity (Pa·s) | at shear rate of 1 s$^{-1}$ | 188 | 176 | 162 |
|  | at shear rate of 100 s$^{-1}$ | 4.12 | 4.01 | 4.44 |
| Printing suitability | At initial printing | Excellent | Poor | Poor |
|  | After continuous printing | Fair | Poor | Poor |
| Volume resistivity |  | Good | Good | Fair |

[*1] a mass ratio of non-volatile matter of the organic compound (B) to the total of the conductive metal particles (A), non-volatile matter of the organic compound (B), non-volatile matter of the organic compound (C), and the organic solvent (D) (hereafter, same definition).
[*2] a mass ratio (R/P) of the total amount R of, in terms of mass of non-volatile matter, the organic compound (B) and the organic compound (C) used to the amount P of the conductive metal particles (A) used (hereafter, same definition).

TABLE 4

|  | Raw material | Example 2 | Example 3 | Example 4 |
|---|---|---|---|---|
| Conductive metal particles (A) | AG2-1C |  | 80 |  |
| Organic compound (B) | TEGO (registered trademark) VARIPLUS SK | 2.0 | 2.5 |  |
|  | VYLON (registered trademark) 200 |  |  | 2.5 |
| Organic compound (C) | TRIXENE BI 7982 | 6.5 | 2.5 | 2.5 |
|  | Denacol (registered trademark) EX-321 | 2.0 |  |  |
|  | POLYLITE (registered trademark) OD-X-2900 |  | 4.0 | 4.0 |
| Organic solvent (D) | BDGAC | 8.5 | 10.0 | 12.0 |
| Phosphoric-acid-group-containing organic compound | DISPERBYK (registered trademark) 111 |  | 0.5 |  |
| Catalyst | U-CAT SA-102 |  | 0.5 |  |
| Non-volatile-matter content[*1] of organic compound (B) (%) |  | 2.0 | 2.5 | 2.5 |
| Ratio of non-volatile matter of organic compounds to metal particles R/P[*2] |  | 0.12 | 0.11 | 0.11 |
| Viscosity (Pa·s) | at shear rate of 1 s$^{-1}$ | 61.2 | 76.6 | 62.8 |
|  | at shear rate of 100 s$^{-1}$ | 3.96 | 4.53 | 3.33 |
| Printing suitability | At initial printing | Excellent | Excellent | Good |
|  | After continuous printing | Excellent | Excellent | Good |
| Volume resistivity |  | Good | Fair | Fair |

TABLE 5

|  | Raw material | Example 5 | Example 6 |
|---|---|---|---|
| Conductive metal particles (A) | AG2-1C | 80 |  |
| Organic compound (B) | S-LEC (registered trademark) KS-10 | 2.5 |  |
|  | EPICLON (registered trademark) 5800 |  | 2.5 |
| Organic compound (C) | TRIXENE BI 7982 | 6.5 |  |
|  | Denacol (registered trademark) EX-321 | 2.0 | 2.5 |
|  | EPICLON (registered trademark) 830 |  | 3.0 |

TABLE 5-continued

|  | Raw material | Example 5 | Example 6 |
|---|---|---|---|
| Organic solvent (D) | BDGAC | 8.0 | 11.0 |
| Phosphoric-acid-group-containing organic compound | DISPERBYK (registered trademark) 111 | 0.5 | |
| Catalyst | U-CAT SA-102 | 0.5 | |
|  | CUREZOL (registered trademark) 2E4MZ | 0.5 | |
| Non-volatile-matter content*[1] of organic compound (B) (%) |  | 2.5 | 2.5 |
| Ratio of non-volatile matter of organic compounds to metal particles R/P*[2] |  | 0.12 | 0.11 |
| Viscosity (Pa·s) | at shear rate of 1 s$^{-1}$ | 74.7 | 73.1 |
|  | at shear rate of 100 s$^{-1}$ | 4.69 | 3.39 |
| Printing suitability | At initial printing | Good | Good |
|  | After continuous printing | Good | Good |
| Volume resistivity |  | Good | Good |

The meanings of the abbreviations of raw materials used for preparation of conductive pastes in Tables above are as follows.

<Conductive Metal Particles>

AG2-1C: a silver powder from DOWA Electronics Materials Co., Ltd., having an average particle size D50 of 0.8 μm <Organic Compounds (B)>

TECO (registered trademark) VARIPLUS SK: a hydrogenated product of a ketone-formaldehyde condensation product, from Evonik Degussa Japan Co., Ltd., having a hydroxy group VYLON (registered trademark) 200: a thermoplastic polyester resin from TOYOBO CO., LTD., having a hydroxy group S-LEC (registered trademark) KS-10: a polyvinyl acetal resin from SEKISUI CHEMICAL CO., LTD., having a hydroxy group EPICLON (registered trademark) 5800: a novolac epoxy resin from DIC Corporation <Organic Compounds (C)>

TRIXENE BI 7982: a blocked polyisocyanate from Baxenden Chemicals Ltd. in which the blocking agent is 3,5-dimethylpyrazole Denacol (registered trademark) EX-321: a trimethylolpropane polyglycidyl ether from Nagase ChemteX Corporation POLYLITE (registered trademark) OD-X-2900: an aromatic polyester polyol from DIC Corporation, having an average molecular weight of 800 or more EPICLON (registered trademark) 830: a bisphenol F diglycidyl ether epoxy resin from DIC Corporation <Organic Solvent (D)>

BDGAC: diethylene glycol monobutyl ether acetate

<Phosphoric-Acid-Group-Containing Compound>

DISPERBYK (registered trademark)-111: a phosphoric-acid-group-containing polymer from BYK Japan KK, having a number-average molecular weight in the range of 1,000 to 10,000

<Curing Agents (Curing Catalysts)>

U-CAT SA 102: a DBU-octylic acid salt from San-Apro Ltd.

CUREZOL (registered trademark) 2E4MZ: 2-ethyl-4-methyl imidazole from SHIKOKU CHEMICALS CORPORATION The evaluation results of Example 1 and Comparative examples 1 and 2 in Table indicate the following. The conductive pastes of Comparative examples 1 and 2 do not satisfy one of numerical ranges defined by the following features of the present invention: a ratio of non-volatile matter of the (B) to a total of the (A) to (D) in terms of mass is 1.0% to 3.0%; and a mass ratio R/P of, in terms of mass of non-volatile matter, a total amount R of the organic compound (B) and the organic compound (C) used to an amount P of the conductive metal particles (A) used is 0.07 to 0.15. These conductive pastes do not provide bezel-pattern conductive patterns having high linearity and no disconnection that are provided by the conductive paste of Example 1, which satisfies both of the numerical ranges.

The evaluation results of Examples 1 and 2 in Tables indicate the following. The conductive paste of Example 2 containing an organic compound having at least one functional group selected from the group consisting of a phosphoric acid group, phosphate groups, and phosphoric ester groups and having a viscosity of 100 Pa·s or less at a shear rate of 1 s$^{-1}$ and a viscosity of 2.0 to 5.0 Pa·s at a shear rate of 100 s$^{-1}$, has better printing suitability after continuous printing than the conductive paste of Example 1, which does not contain the above-described phosphoric-acid-group-containing organic compound and has a viscosity of more than 100 Pa·s at a shear rate of 1 s$^{-1}$.

Furthermore, the conductive pastes of Examples that employ hydroxy-group-containing thermoplastic resins as the organic compounds (B) can be fired at lower temperatures than that of the conductive paste of Example 6, which employs a polyfunctional epoxy compound as the organic compound (B). Thus, energy required for firing can be reduced. In addition, conductive bezel-patterns, which are more complicated than linear patterns alone, can be formed even on a plastic film having low heat resistance or a transparent conductive film on the plastic film serving as a support.

The conductive pastes of Examples employing blocked polyisocyanate compounds according to the present invention allow dissociation of blocking agents at lower temperatures than before. Accordingly, conductive patterns of cured films can be formed even on non-heat-resistant printing objects such as transparent conductive films or PET films, without causing warpage or the like at low temperatures for short period of time. The obtained conductive patterns have sufficiently high conductivity and adhesion to substrates.

INDUSTRIAL APPLICABILITY

A conductive paste according to the present invention can be used for forming conductive patterns of various electric components or electronic components.

The invention claimed is:

1. A conductive paste for bezel-pattern printing performed by a gravure offset printing process, the conductive paste comprising conductive metal particles (A); an organic compound (B) that is solid at 50° C. and has a boiling point of more than 300° C. at normal pressure; an organic compound (C) that is liquid at 50° C. and has a boiling point of more than 300° C. at normal pressure; and an organic solvent (D) that is not the (B) or (C), does not have reactivity with the (B) or (C), and has a boiling point of 170° C. to 300° C. at normal pressure,
wherein a ratio of non-volatile matter of the (B) to a total of the (A) to (D) in terms of mass is 1.0% to 3.0%, and a mass ratio R/P of a total amount R of, in terms of mass of non-volatile matter, the organic compound (B) and the organic compound (C) used to an amount P of the conductive metal particles (A) used is 0.07 to 0.15.

2. The conductive paste according to claim 1, wherein the organic solvent (D) has a blanket swelling ratio of 5% to 20%.

3. The conductive paste according to claim 1, having a paste viscosity of 100 Pa·s or less at a shear rate of 1 s$^{-1}$ and a paste viscosity of 2.0 to 5.0 Pa·s at a shear rate of 100 s$^{-1}$.

4. The conductive paste according to claim 1, further comprising an organic compound having at least one functional group selected from the group consisting of a phosphoric acid group, phosphate groups, and phosphoric ester groups.

5. The conductive paste according to claim 1, wherein the organic compound (B) includes a thermoplastic resin having a hydroxy group.

6. The conductive paste according to claim 1, wherein the organic compound (B) includes a thermoplastic resin having a hydroxy group, and the organic compound (C) includes a blocked polyisocyanate compound and a polyfunctional epoxy compound and/or a high-molecular-weight polyol compound.

7. The conductive paste according to claim 1, comprising no inorganic binder for bonding the conductive metal particles to a printing object, the inorganic binder melting at a temperature that is equal to or more than a decomposition temperature of the organic compound (B) and less than a melting point of the conductive metal particles.

8. A conductive-pattern-printed product formed with the conductive paste according to claim 1.

9. The conductive paste according to claim 2, having a paste viscosity of 100 Pa·s or less at a shear rate of 1 s$^{-1}$ and a paste viscosity of 2.0 to 5.0 Pa·s at a shear rate of 100 s$^{-1}$.

10. The conductive paste according to claim 2, further comprising an organic compound having at least one functional group selected from the group consisting of a phosphoric acid group, phosphate groups, and phosphoric ester groups.

11. The conductive paste according to claim 2, wherein the organic compound (B) includes a thermoplastic resin having a hydroxy group.

12. The conductive paste according to claim 2, wherein the organic compound (B) includes a thermoplastic resin having a hydroxy group, and the organic compound (C) includes a blocked polyisocyanate compound and a polyfunctional epoxy compound and/or a high-molecular-weight polyol compound.

13. The conductive paste according to claim 2, comprising no inorganic binder for bonding the conductive metal particles to a printing object, the inorganic binder melting at a temperature that is equal to or more than a decomposition temperature of the organic compound (B) and less than a melting point of the conductive metal particles.

14. A method for forming a conductive pattern by a gravure offset printing process, the method employing a gravure plate having a bezel-pattern recess to be filled with a paste, a doctor configured to fill the paste into the recess of the gravure plate, and a blanket onto which the paste is transferred from the recess of the gravure plate, the method comprising:
supplying a printing object so as to face the blanket, making the printing object and the blanket come into contact with each other by pressing to print a pattern corresponding to a fine wiring pattern on the blanket onto the printing object, and subsequently performing firing,
wherein the paste is a conductive paste comprising:
conductive metal particles (A); an organic compound (B) that is solid at 50° C. and has a boiling point of more than 300° C. at normal pressure; an organic compound (C) that is liquid at 50° C. and has a boiling point of more than 300° C. at normal pressure; and an organic solvent (D) that is not the (B) or (C), does not have reactivity with the (B) or (C), and has a boiling point of 170° C. to 300° C. at normal pressure,
wherein a ratio of non-volatile matter of the (B) to a total of the (A) to (D) in terms of mass is 1.0% to 3.0%, and a mass ratio R/P of a total amount R of, in terms of mass of non-volatile matter, the organic compound (B) and the organic compound (C) used to an amount P of the conductive metal particles (A) used is 0.07 to 0.15.

15. The method for forming a conductive pattern according to claim 14, wherein the gravure plate has the recess corresponding to a bezel pattern, the recess having a line width of 10 to 50 μm and a depth of 5 to 20 μm.

16. The method for forming a conductive pattern according to claim 14, comprising a step of, after the printing onto the printing object, drying the blanket having absorbed the organic solvent (D).

17. The method for forming a conductive pattern according to claim 14, wherein the firing is performed at 150° C. or less.

18. The method for forming a conductive pattern according to claim 16, wherein the printing object is a polyethylene terephthalate film or a transparent conductive film having a polyethylene terephthalate film as a support.

19. A method for forming a conductive pattern by a gravure offset printing process according to claim 14, wherein the organic solvent (D) has a blanket swelling ratio of 5% to 20%.

20. The method for forming a conductive pattern according to claim 15, comprising a step of, after the printing onto the printing object, drying the blanket having absorbed the organic solvent (D).

* * * * *